(12) United States Patent
Chou et al.

(10) Patent No.: US 8,610,227 B2
(45) Date of Patent: Dec. 17, 2013

(54) FORMATION OF EMBEDDED MICRO-LENS

(75) Inventors: Shih Pei Chou, Tainan (TW); Shih-Chang Liu, Alian Township, Kaohsiung County (TW); Yeur-Luen Tu, Taichung (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 234 days.

(21) Appl. No.: 12/903,871

(22) Filed: Oct. 13, 2010

(65) Prior Publication Data

US 2012/0091549 A1 Apr. 19, 2012

(51) Int. Cl.
*H01L 31/0232* (2006.01)

(52) U.S. Cl.
USPC .......................................... 257/432

(58) Field of Classification Search
USPC ................. 438/57–98; 257/431–466
See application file for complete search history.

(56) References Cited

U.S. PATENT DOCUMENTS

| | | | | |
|---|---|---|---|---|
| 5,080,706 A * | 1/1992 | Snyder et al. | | 65/102 |
| 5,324,623 A * | 6/1994 | Tsumori | | 430/321 |
| 5,764,319 A * | 6/1998 | Nishihara | | 349/8 |
| 6,856,712 B2 * | 2/2005 | Fauver et al. | | 385/12 |
| 7,230,764 B2 * | 6/2007 | Mullen et al. | | 359/619 |
| 7,330,315 B2 * | 2/2008 | Nilsen | | 359/640 |
| 7,527,398 B2 * | 5/2009 | Song et al. | | 362/330 |
| 7,695,168 B2 * | 4/2010 | Gueyvandov et al. | | 362/339 |
| 2002/0001431 A1 * | 1/2002 | Yonekubo | | 385/32 |
| 2002/0034014 A1 * | 3/2002 | Gretton et al. | | 359/619 |
| 2002/0057497 A1 * | 5/2002 | Gardiner et al. | | 359/625 |
| 2002/0097496 A1 * | 7/2002 | Lu | | 359/628 |
| 2005/0242271 A1 * | 11/2005 | Weng et al. | | 250/214.1 |
| 2006/0027825 A1 * | 2/2006 | Kuriyama | | 257/98 |
| 2006/0138412 A1 * | 6/2006 | Park | | 257/53 |
| 2009/0256228 A1 * | 10/2009 | Boettiger et al. | | 257/432 |

\* cited by examiner

*Primary Examiner* — Fernando L Toledo
*Assistant Examiner* — Karen Kusumakar
(74) *Attorney, Agent, or Firm* — Haynes and Boone, LLP

(57) ABSTRACT

Provided is an image sensor device. The image sensor device includes a pixel formed in a substrate. The image sensor device includes a first micro-lens embedded in a transparent layer over the substrate. The first micro-lens has a first upper surface that has an angular tip. The image sensor device includes a color filter that is located over the transparent layer. The image sensor device includes a second micro-lens that is formed over the color filter. The second micro-lens has a second upper surface that has an approximately rounded profile. The pixel, the first micro-lens, the color filter, and the second micro-lens are all at least partially aligned with one another in a vertical direction.

20 Claims, 6 Drawing Sheets

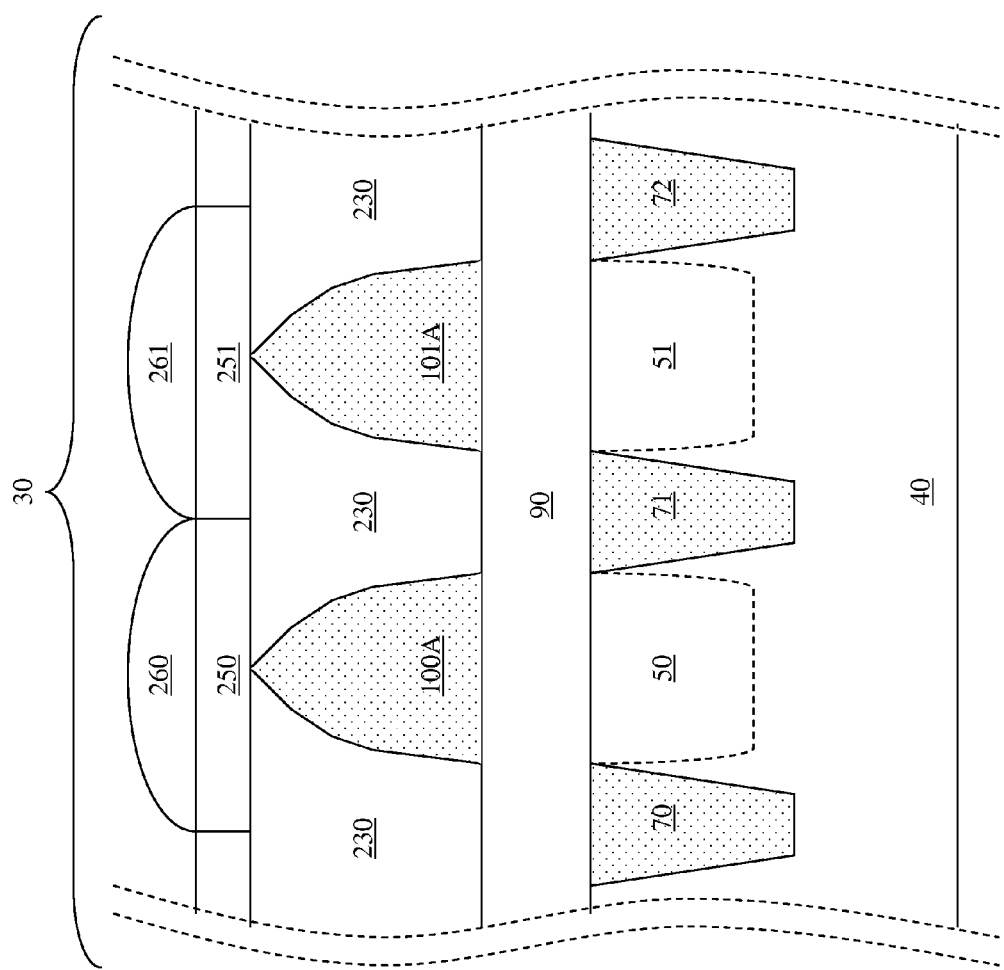

US 8,610,227 B2

FORMATION OF EMBEDDED MICRO-LENS

BACKGROUND

Semiconductor image sensors are used for sensing light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, that can absorb radiation projected toward the substrate and convert the sensed radiation into electrical signals.

Semiconductor image sensors use micro-lenses to focus incoming light. A micro-lens can be formed in an embedded manner inside a layer of the image sensor. In that case, an external micro-lens may also be used to complement the embedded micro-lens. Having both an external lens and an embedded lens may be desirable because they improve light sensitivity, for example sensitivity to black and white light. However, traditional methods of forming the embedded micro-lens are complex and time consuming. The embedded micro-lenses formed by the traditional methods also tend to have poor light-focusing performance.

Therefore, while existing methods of fabricating embedded micro-lenses for image sensors have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-6 are diagrammatic fragmentary cross-sectional side views of a semiconductor device at various stages of fabrication according to various aspects of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
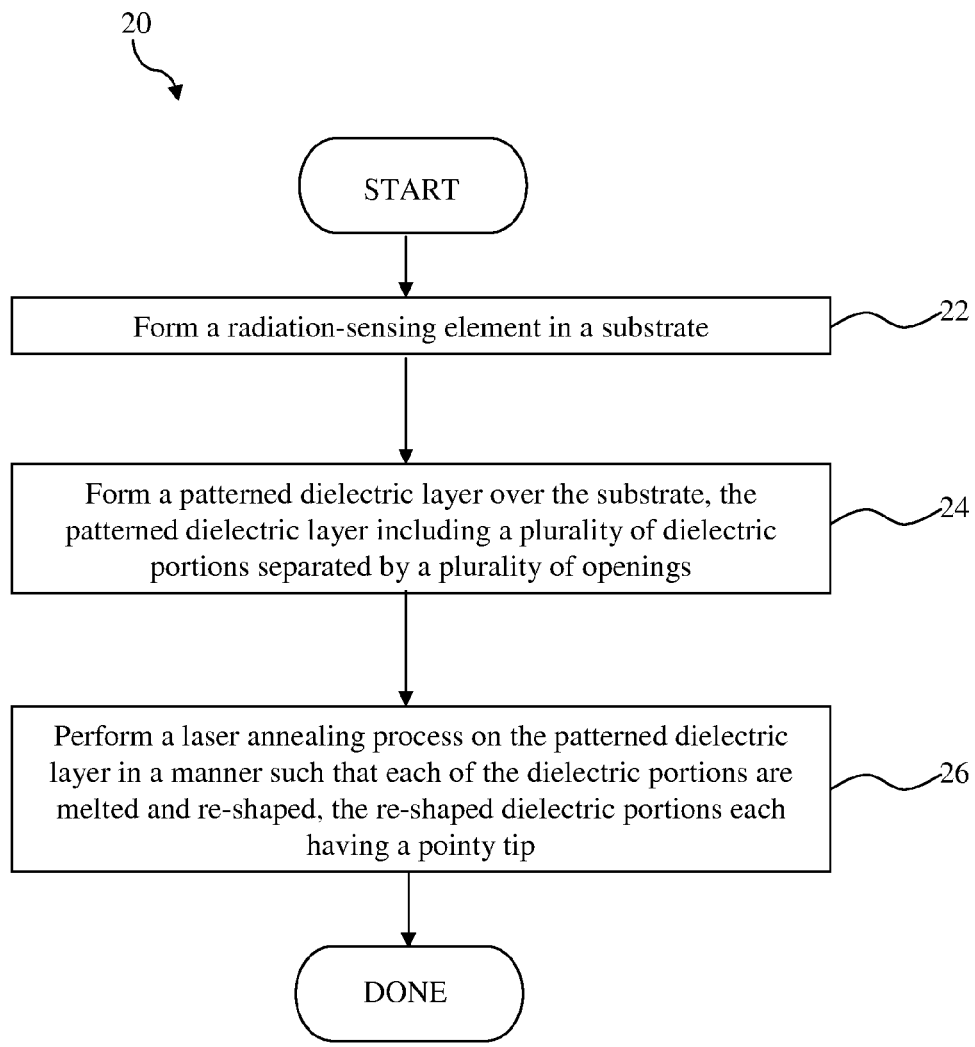
FIG. 1 is a flowchart illustrating a method for fabricating a semiconductor device according to various aspects of the present disclosure.

Illustrated in FIG. 1 is a flowchart of a method 20 for fabricating a front-side illuminated (FSI) image sensor device according to various aspects of the present disclosure. Referring to FIG. 1, the method 20 begins with block 22 in which a radiation-sensing element is formed in a substrate. The method 20 continues with block 24 in which a patterned dielectric layer is formed over the substrate. The patterned dielectric layer includes a plurality of dielectric portions that are separated by a plurality of openings. The method 20 continues with block 26 in which a laser annealing process is performed on the patterned dielectric layer in a manner such that each of the dielectric portions are melted and re-shaped. The re-shaped dielectric portions each have a pointy tip.

FIGS. 2 to 6 are diagrammatic fragmentary cross-sectional side views of a FSI image sensor device 30 at various stages during its fabrication according to various aspects of the present disclosure. It is understood that FIGS. 2 to 6 have been simplified for a better understanding of the inventive concepts of the present disclosure.

Figure 2:
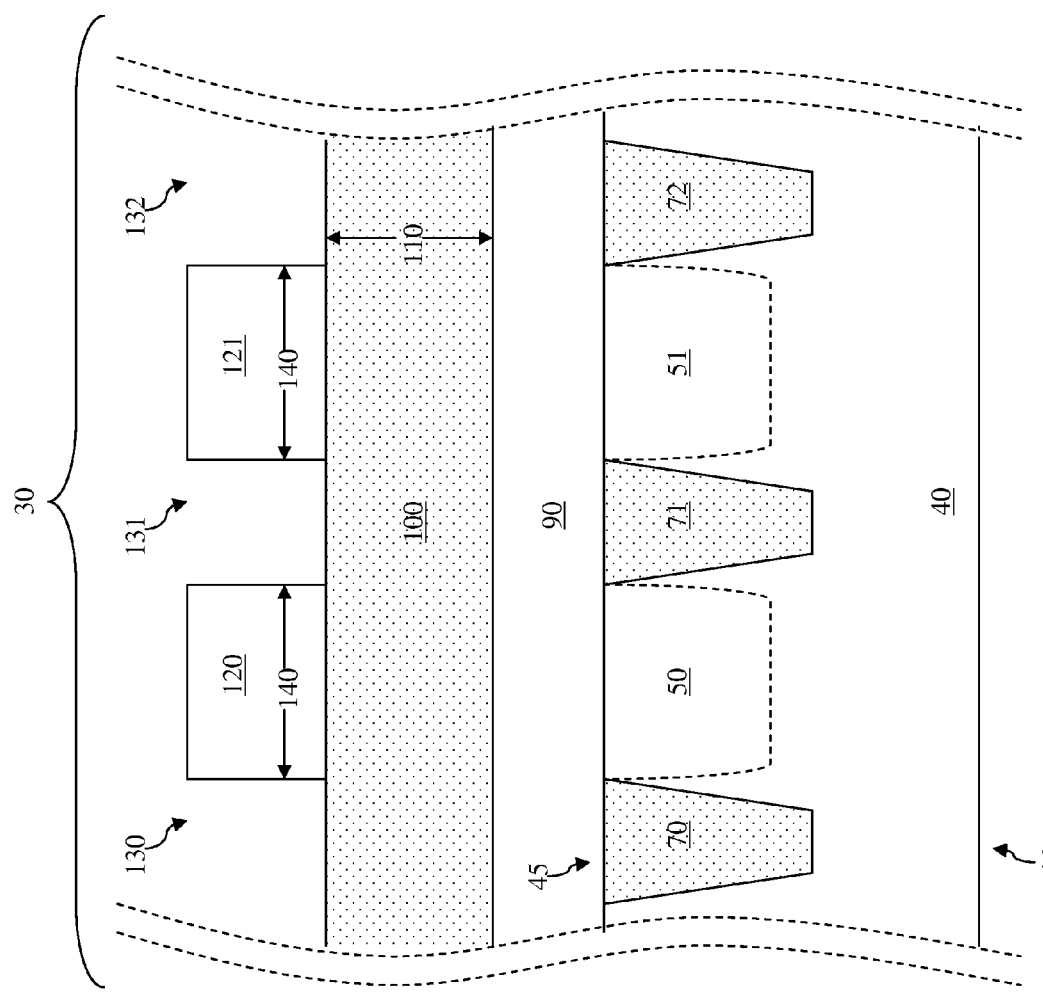

Referring to FIG. 2, the image sensor device 30 includes a substrate 40, also referred to as a wafer. The substrate 40 is a silicon substrate doped either with a P-type dopant or with an N-type dopant. The P-type dopant may be boron, and the N-type dopant may be phosphorous or arsenic. The substrate 40 may include other elementary semiconductors such as germanium. The substrate 40 may optionally include a compound semiconductor and/or an alloy semiconductor. Further, the substrate 40 may include an epitaxial layer (epi layer), may be strained for performance enhancement, and may include a silicon-on-insulator (SOI) structure.

The substrate 40 has a front side 45 and a back side 46, which are also the front and back sides of the image sensor device 30, respectively. The image sensor device 30, when completed, will sense or detect incoming radiation waves projected toward the substrate 40 from the front side 45. In other words, the radiation waves will enter the substrate 40 from the front side 45.

The substrate 40 includes a plurality of pixels, also referred to as radiation-sensing elements or light-sensing elements. The radiation-sensing elements are operable to sense or detect radiation waves projected toward the substrate 40. For the sake of providing an example, two of such radiation-sensing elements are shown in FIG. 2 and designated with reference numerals 50 and 51, though it is understood that any number of radiation-sensing elements may be formed in the substrate 40 to implement the image sensor device 30.

The radiation-sensing elements 50-51 are formed by performing a plurality of ion implantation processes on the substrate 40. For example, N+ implants, array-N-well implants, and deep-array-N-well implants may be performed. The ion implantation processes may include multiple implant steps and may use different dopants, implant dosages, and implantation energies. The ion implantation processes may also use different masks that have different patterns and opening sizes. The radiation-sensing elements 50-51 may also be formed in a doped well (not illustrated) having an opposite doping polarity as the substrate 40.

In one embodiment, the radiation-sensing elements 50-51 include photodiodes. In other embodiments, the radiation-sensing elements 50-51 may include pinned photodiodes (PPD), photogates, reset transistors, source follower transistors, transfer transistors, or other suitable devices.

The radiation-sensing elements 50-51 are also separated by isolation structures, for example isolation structures 70, 71, and 72. The isolation structures 70-72 may include shallow trench isolation (STI) or deep trench isolation (DTI) devices. The STI or DTI devices are formed by etching openings (or trenches) in the substrate 40 and thereafter filling the openings with a suitable material. This suitable material has a refractive index value that is less than a refractive index value of silicon, which is approximately 4. In other words, the substrate 40 is optically denser than the STI or DTI devices. In an embodiment, the STI or DTI devices include silicon oxide, which has a refractive index value of approximately 1.46. In another embodiment, the STI or DTI devices include silicon nitride, which has a refractive index value of approximately 2.05. In yet another embodiment, the STI or DTI devices include air, which has a refractive index value of approximately 1.

The isolation structures 70-72 may also each include a doped well that surrounds the STI or DTI device. The isolation structures 70-72 serve to prevent or substantially reduce cross-talk between adjacent radiation-sensing elements, such as radiation-sensing elements 50-51. The cross-talk may be electrical, or optical, or both. If left unabated, the cross-talk will degrade the performance of the image sensor device 30.

In addition, although not illustrated for the sake of simplicity, transistor devices may be formed in the substrate 40. For example, a metal-oxide-semiconductor field-effect transistor (MOSFET) device may be formed in the substrate 40. The MOSFET device may have a gate, a source, and a drain. The source may be coupled to the radiation-sensing elements 50 or 51. The gate and the drain may be coupled to external devices through vias or contacts of an interconnect structure that will be discussed later. The image sensor device 30 may further include additional circuitry and input/outputs adjacent to the pixels for providing an operation environment for the pixels (such as pixels 50-51) and for supporting external communication with the pixels.

Still referring to FIG. 2, an interconnect structure 90 is formed over the substrate 40. The interconnect structure 90 includes a plurality of patterned dielectric layers and conductive layers that provide interconnections (e.g., wiring) between the various doped features, circuitry, and input/output of the image sensor device 30. The interconnect structure 90 includes an interlayer dielectric (ILD) and a multilayer interconnect (MLI) structure formed in a configuration such that the ILD separates and isolates each MLI structure from other MLI structures. The MLI structure includes contacts, vias and metal lines formed on the substrate 40.

In one example, the MLI structure may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (PVD), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

A dielectric layer 100 is then formed over the interconnect structure 90. In an embodiment, the dielectric layer 100 includes a silicon nitride material. The dielectric layer 100 can be formed by a deposition process known in the art such as CVD, PVD, atomic layer deposition (ALD), or combinations thereof. The dielectric layer 100 has a thickness 110. In an embodiment, the thickness 110 is in a range from about 2000 Angstroms to about 4000 Angstroms.

A patterned photoresist layer is formed over the dielectric layer 100. The patterned photoresist layer has a plurality of photoresist portions that are separated by a plurality of openings. For the sake of simplicity, photoresist portions 120-121 and openings 130-132 are illustrated herein. The patterned photoresist layer is formed by first depositing a layer of photoresist material over the dielectric layer 100, for example through a spin coating process. Thereafter, a photolithography process known in the art is performed to pattern the photoresist material into the photoresist portions 120-121. The photolithography process may include a plurality of masking, exposing, baking, developing, and rinsing processes. The photoresist portions 120-121 each have a width (or a lateral dimension) 140. The photoresist portions 120-121 are also partially aligned vertically with the radiation-sensing elements 50-51. It is understood, however, that the photoresist portions 120-121 may not have the same width values as the radiation-sensing elements 50-51, even though they are at least partially aligned.

Figure 3:
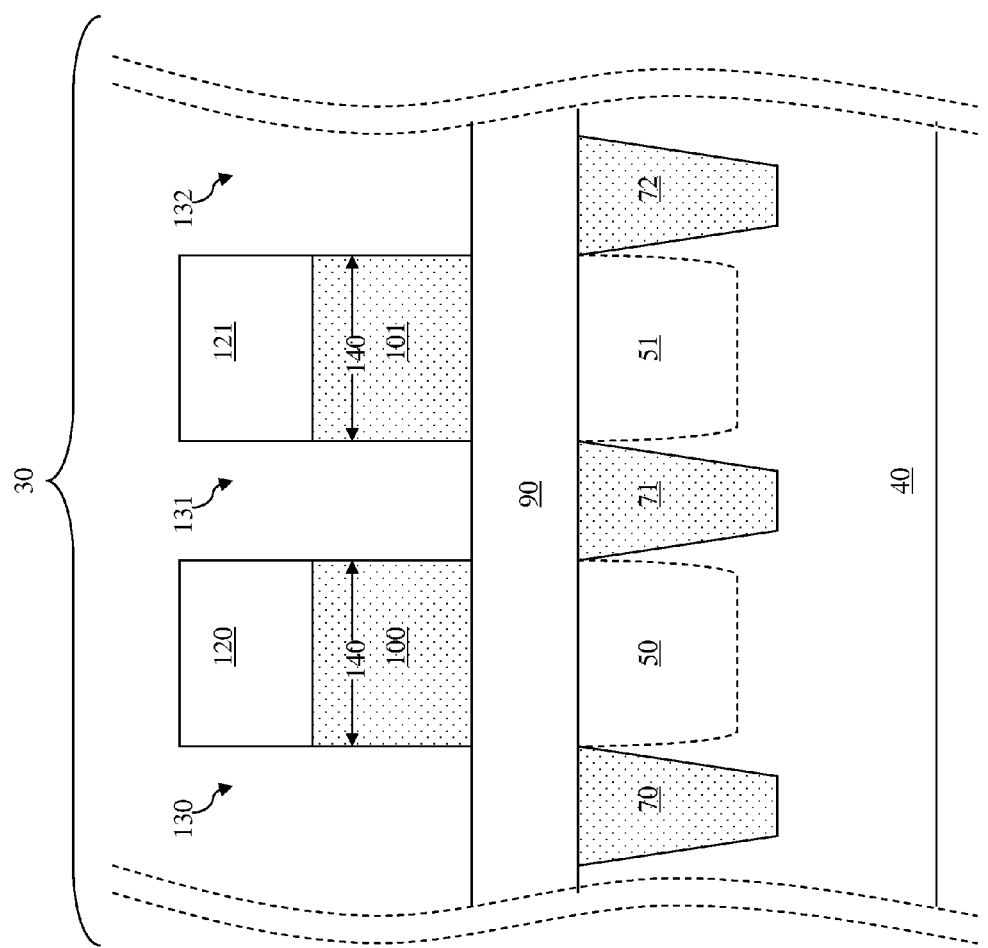

Referring now to FIG. 3, a wet etching process is performed to etch the openings 130-132 through the dielectric layer 100. The patterned photoresist portions 120-121 are used as protective masks in this process. Consequently, dielectric portions 100-101 are formed. The dielectric portions 100-101 have approximately rectangular shapes and each have a lateral dimension that is equal to the width 140 (which was the width of the photoresist portions 120-121). Since the photoresist portions 120-121 were approximately aligned with the radiation-sensing elements 50-51, respectively, the dielectric portions 100-101 are also approximately aligned with the radiation-sensing elements 50-51, respectively.

Figure 4:
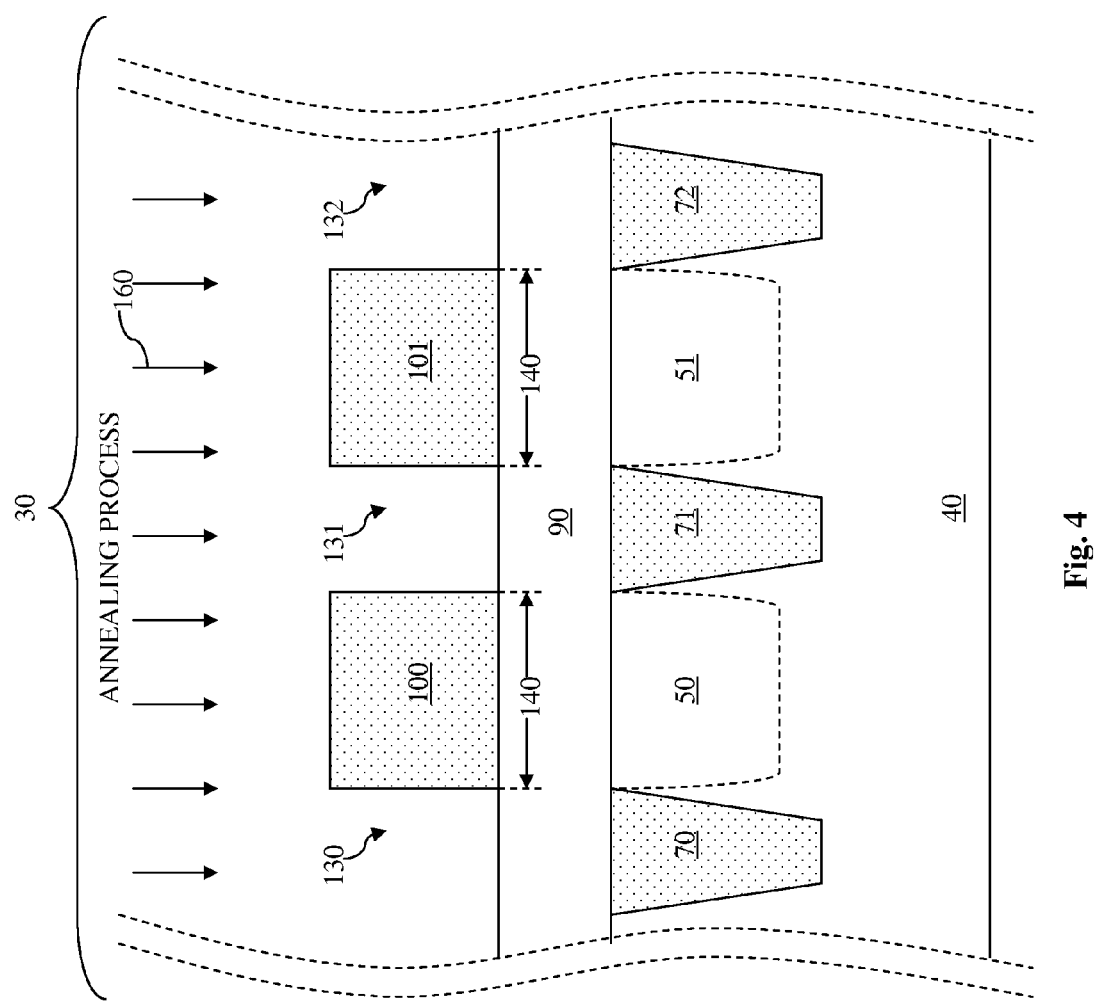

Referring now to FIG. 4, the photoresist portions 120-121 are removed in a stripping or ashing process known in the art. Thereafter, an annealing process 160 is performed on the semiconductor device 30 to melt the dielectric portions 100-101. The annealing process 160 is performed using the following process parameters:

a laser source that is an ultra-violet light with a wavelength that is in a range from about 300 nanometers to about 600 nanometers;

an annealing duration that is in a range from about 150 nanoseconds to about 450 nanoseconds; and an annealing energy that is in a range from about 0.5 mili-joules to about 2.5 mili-joules.

Figure 5:
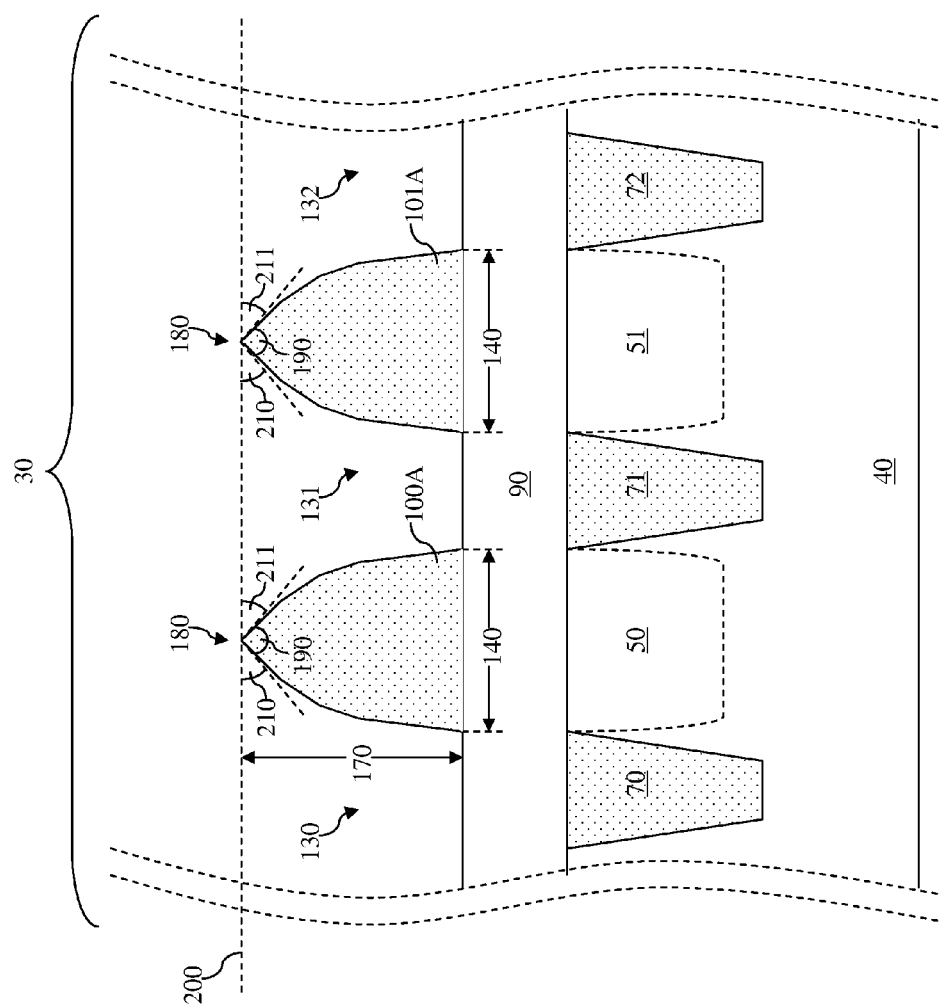

The annealing process 160 melts the dielectric portions 100-101 so that they turn from a solid form into a liquid form and thus undergo a re-shaping process. Referring to FIG. 5, when the annealing process 160 is over and the melted dielectric portions 100-101 are cooled, they become re-shaped dielectric portions 100A and 101A. The re-shaped dielectric portions 100A and 101A each have substantially the same width 140 as the dielectric portions 100-101 before the annealing process 160 is performed.

The re-shaped dielectric portions 100A and 101A also each have a height 170 (or a vertical dimension) that is greater than the thickness 110 (shown in FIG. 2) of the dielectric layer 100, which is the height of the dielectric portions 100-101 before being melted. In an embodiment, a ratio between the height 170 and the thickness 110 is in a range from about 1.5 to about 2.5, for example, about 1.75. Stated differently, the re-shaped dielectric portions 100A-101A are taller than the original un-melted dielectric portions 100-101 by anywhere from about 1.5 times to 2.5 times.

As can be seen from FIG. 5, the re-shaped dielectric portions 100A and 101A each have a pointy or angular tip 180 (or a tip portion). The pointy tip 180 is protruding at the tallest region of an upper surface of the re-shaped dielectric portions 100A and 101A. The pointy tip 180 is formed as a result of the dielectric portions 100A and 101A having been melted into liquid form and cooled into a solid form again. The pointy tip 180 has an angle 190. In an embodiment, the angle 190 is in a range from about 100 degrees to about 120 degrees. An alternative way of characterizing the pointy tip 180 is by drawing an imaginary horizontal line 200 that intersects the highest point of the pointy tip 180. This imaginary horizontal line 200 forms two angles 210 and 211 with the re-shaped dielectric portions 100A and 101A on either side of the pointy tips 180. The angles 210-211 are each in a range from about 30 degrees to about 40 degrees.

It is understood that the shape and geometry of the re-shaped dielectric portions 100A and 101A may be adjusted by tuning the values of the width 140 (through the photolithography process that forms the patterned photoresist portions 120, shown in FIG. 3) and the thickness 110 of the dielectric layer 100 (shown in FIG. 2, which is the height of the un-melted dielectric portions 100-101).

The re-shaped dielectric portions 100A and 101A serve as micro-lenses to help focus incoming radiation such as light. The pointy or sharp profile of the re-shaped dielectric portions 100A and 101A help improve the radiation-focusing performance. This will be discussed in more detail later.

Referring now to FIG. 6, a dielectric material 230 is formed over the re-shaped dielectric portions 100A and 101A. The dielectric material 230 fills the openings 130-132 (shown in FIG. 5). The dielectric material 230 includes a dielectric material different from the re-shaped dielectric portions 100A and 101A. For example, in an embodiment where the dielectric portions 100A and 101A include silicon nitride, then the dielectric material 230 may include silicon oxide or silicon oxy-nitride. The dielectric material 230 is then planarized by a process known in the art to achieve a smooth and flat upper surface, for example by a chemical-mechanical-polishing (CMP) process.

Thereafter, a color filter layer containing a plurality of color filters is formed over the planarized layer 230. For the sake of simplicity, only two of such color filters 250 and 251 are shown in FIG. 6. The color filters 250 and 251 can support the filtering of radiation waves having different wavelengths, which may correspond to different colors, such as primary colors including red, green, and blue, or complementary colors including cyan, yellow, and magenta. The color filters 250 and 251 may also be positioned such that the desired incident light radiation is directed thereon and therethrough. For example, the color filter 250 may filter the incident radiation such that only red light reaches the radiation-sensing element 50. The color filter 251 may filter the incident radiation such that only green light reaches the radiation-sensing element 51. The color filters 250 and 251 may include a dye-based (or pigment based) polymer or resin to achieve the filtering of specific wavelength bands.

After the color filter layer is formed, a top micro-lens layer is formed over the color filter layer. For the sake of simplicity, only two of such top micro-lenses 260 and 261 are illustrated in FIG. 6. The top micro-lenses 260-261 help direct radiation toward the radiation-sensing elements 50-51, respectively. The top micro-lenses 260-261 may be positioned in various arrangements and have various shapes depending on a refractive index of material used for the top micro-lenses and distance from the surface of the substrate 40. In an embodiment, the top micro-lenses 260-261 each include an organic material, for example a photoresist material, or a polymer material. The top micro-lenses 260-261 are formed by one or more photolithography processes.

Although not specifically illustrated for the sake of simplicity, it is understood that an anti-reflective layer may be formed underneath the color filter layer, and a spacer material may be formed between the color filter layer and the top micro-lens layer. Also, while the elements shown in FIGS. 2-6 are not drawn to scale and may have different proportions in production, it is understood that the top micro-lens 260, the color filter 250, the re-shaped dielectric portion 100A (functioning as an embedded micro-lens), and the radiation-sensing element 50 are all at least partially aligned vertically with one another. The same is true for the top micro-lens 261, the color filter 251, the re-shaped dielectric portion 100B (functioning as an embedded micro-lens), and the radiation-sensing element 51.

As discussed above, the re-shaped dielectric portions 100A and 101A each function as an embedded micro-lens. Such embedded micro-lenses offer advantages over existing micro-lenses, it being understood that other embodiments of the embedded micro-lenses constructed according to the present disclosure may offer different advantages, and that no particular advantage is required for all embodiments. One advantage is that the formation of the embedded micro-lenses herein involves simple fabrication processes. For example, the embedded micro-lenses are formed by a combination of an etching process and an annealing process. In comparison, traditional micro-lenses are often times formed by a plurality of deposition, patterning (which typically includes dry etching), baking, and ashing processes. These processes may need to be repeated quite a number of times before an acceptable shape and geometry can be achieved for a traditional micro-lens. As such, the formation of the traditional micro-lenses are time consuming and expensive, whereas the formation of the embedded micro-lenses herein is quick and cheap.

Another advantage offered by the embedded micro-lenses herein is improved light-focusing performance. Micro-lenses constructed by traditional methods typically have a rounded profile for their upper surfaces. The round profile results in a somewhat diminished light-focusing performance. In contrast, the embedded micro-lenses herein have sharp or angular profiles for their upper surfaces. The sharp or angular profiles are more efficient at focusing the incoming light. As such, the embedded micro-lenses herein have improved light-focusing performance over the traditional micro-lenses. Furthermore, micro-lenses formed by the traditional methods typically have rough surfaces due to the plurality of dry etching processes performed. In comparison, the embedded micro-lenses herein are not formed by any dry etching process, and consequently have smoother surfaces. The smoother surfaces also translate into better light-focusing performance.

One of the broader forms of the present disclosure is a semiconductor device. The semiconductor device includes: a radiation-sensing element formed in a substrate; a transparent layer formed over the substrate; and a micro-lens embedded in the transparent layer, wherein the micro-lens has a pointy tip portion.

Another one of the broader forms of the present disclosure is an image sensor device. The image sensor device includes: a pixel located in a substrate; a first micro-lens embedded in a layer over the substrate, a first upper surface of the first micro-lens having an angular tip; a color filter located over the layer; and a second micro-lens located over the color filter, a second upper surface of the second micro-lens having an approximately rounded profile; wherein the pixel, the first micro-lens, the color filter, and the second micro-lens are all at least partially aligned with one another.

Another one of the broader forms of the present disclosure is a method. The method includes: forming a radiation-sensing element in a substrate; forming a patterned dielectric layer over the substrate, the patterned dielectric layer including a plurality of dielectric portions separated by a plurality of openings; and performing a laser annealing process on the patterned dielectric layer in a manner such that each of the dielectric portions are melted and re-shaped, the re-shaped dielectric portions each having a pointy tip.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a radiation-sensing element formed in a substrate;
   a transparent layer formed over the substrate; and
   a micro-lens embedded in the transparent layer and positioned to focus received radiation onto the radiation-sensing element situated beneath the micro-lens, wherein the micro-lens has a curved upper surface with an angular tip with a pointed profile.

2. The semiconductor device of claim 1, further including:
   a color filter layer formed over the transparent layer; and
   a further micro-lens formed over the color filter layer.

3. The semiconductor device of claim 2, wherein the micro-lens embedded in the transparent layer and the further micro-lens are substantially aligned.

4. The semiconductor device of claim 2, wherein the micro-lens embedded in the transparent layer and the further micro-lens include different materials.

5. The semiconductor device of claim 4, wherein the micro-lens embedded in the transparent layer includes a dielectric material, and the further micro-lens includes an organic material.

6. The semiconductor device of claim 1, wherein the angular tip has an angle that is in a range from about 100 degrees to about 120 degrees.

7. The semiconductor device of claim 1, wherein the semiconductor device is a front-side illuminated image sensor.

8. An image sensor device, comprising:
   a pixel located in a substrate;
   a first micro-lens embedded in a layer over the substrate, a first curved upper surface of the first micro-lens having an angular tip with a pointed profile;
   a color filter located over the layer; and
   a second micro-lens located over the color filter, a second upper surface of the second micro-lens having an approximately rounded profile;
   wherein the pixel, the first micro-lens, the color filter, and the second micro-lens are all at least partially aligned with one another such that the first micro-lens focuses light onto the pixel.

9. The image sensor device of claim 8, wherein the first and second micro-lenses are formed over the substrate in a vertical direction; and wherein the tip of the first micro-lens forms an angle with an imaginary line in a horizontal direction, the angle being between about 30 degrees and about 40 degrees.

10. The image sensor device of claim 8, wherein:
    the first micro-lens includes a dielectric material; and
    the second micro-lens includes an organic material.

11. The image sensor device of claim 8, wherein the image sensor device is a front-side illuminated image sensor.

12. A method, comprising:
    forming a radiation-sensing element in a substrate;
    forming a patterned dielectric layer over the substrate, the patterned dielectric layer including a plurality of dielectric portions separated by a plurality of openings; and
    performing a laser annealing process on the patterned dielectric layer in a manner such that each of the dielectric portions are melted and re-shaped, the re-shaped dielectric portions each having a curved upper surface with an angular tip with a pointed profile.

13. The method of claim 12, wherein the forming the patterned dielectric layer is carried out in a manner so that the dielectric portions each have a substantially rectangular shape before the performing the laser annealing process.

14. The method of claim 12, wherein the dielectric portions each includes a silicon nitride material.

15. The method of claim 12, further including, after the performing the laser annealing process:
    forming a transparent material over the re-shaped dielectric portions;
    planarizing the transparent material to form a transparent layer with the re-shaped dielectric portions embedded therein;
    forming a color filter layer over the transparent layer; and
    forming a plurality of micro-lenses over the color filter layer.

16. The method of claim 15, wherein each of the micro-lenses is aligned with one of the re-shaped dielectric portions, the re-shaped dielectric portions each serving as an embedded micro-lens within the transparent layer.

17. The method of claim 12, wherein the performing the laser annealing process is carried out in a manner so that the angular tip has an angle that is in a range from about 100 degrees to about 120 degrees.

18. The method of claim 12, wherein the performing the laser annealing process is carried out using the following process parameters:
    a laser source that is an ultra-violet light with a wavelength that is in a range from about 300 nanometers to about 600 nanometers;
    an annealing duration that is in a range from about 150 nanoseconds to about 450 nanoseconds; and
    an annealing energy that is in a range from about 0.5 mili-joules to about 2.5 mili-joules.

19. The method of claim 12, wherein:
    the forming the patterned dielectric layer is carried out in a manner so that each of the dielectric portions has a first width and a first height prior to being annealed; and
    the performing the annealing process is carried out in a manner so that each of the re-shaped dielectric portions has a second width and a second height, the second width being approximately equal to the first width, and the second height being greater than the first height.

20. The method of claim 19, wherein a ratio of the second height and the first height is in a range from about 1.5 to about 2.5.

* * * * *